United States Patent
Wang et al.

(10) Patent No.: US 6,569,770 B2
(45) Date of Patent: May 27, 2003

(54) METHOD FOR IMPROVING OXIDE EROSION OF TUNGSTEN CMP OPERATIONS

(75) Inventors: Xian Bin Wang, Singapore (SG); Yi Xu, Burnaby (CA); Subramanian Balakumar, Singapore (SG); Cuiyang Wang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 100 days.

(21) Appl. No.: 09/893,080

(22) Filed: Jun. 28, 2001

(65) Prior Publication Data

US 2003/0003745 A1 Jan. 2, 2003

(51) Int. Cl.$^7$ ............................................. H01L 21/00
(52) U.S. Cl. .......................... 438/692; 216/38; 216/88; 438/754
(58) Field of Search ................... 438/690, 692, 438/693, 723, 745, 754–756; 216/38, 88, 89

(56) References Cited

U.S. PATENT DOCUMENTS

| | | | |
|---|---|---|---|
| 5,385,867 A | 1/1995 | Ueda et al. | 437/195 |
| 6,001,730 A | 12/1999 | Farkas et al. | 438/627 |
| 6,048,796 A | 4/2000 | Wang et al. | 438/692 |
| 6,057,602 A | 5/2000 | Hudson et al. | 257/752 |
| 6,071,809 A | 6/2000 | Zhao | 438/634 |
| 6,207,570 B1 * | 3/2001 | Mucha | 438/692 |
| 6,274,499 B1 * | 8/2001 | Gupta et al. | 438/692 |

OTHER PUBLICATIONS

Co-pending U.S. patent application Ser. No. 09/442,493 to S. Gupta et al. filed on Nov. 19, 1999.
Allowed U.S. patent application Ser. No. 09/110,419 to R.R. Sudipto filed on Jul. 6, 1998.

* cited by examiner

Primary Examiner—William A. Powell
(74) Attorney, Agent, or Firm—George O. Saile; Rosemary L.S. Pike

(57) ABSTRACT

A new method to prevent oxide erosion in a metal plug process by employing a silicon nitride layer over the oxide is described. An oxide layer is deposited overlying a semiconductor substrate. A silicon nitride layer is deposited overlying the oxide layer. An opening is etched through the silicon nitride layer and into the oxide layer. A barrier metal layer is deposited overlying the silicon nitride layer and into the opening. A metal layer is deposited overlying the barrier metal layer. The metal layer and barrier metal layer are polished away using chemical mechanical polishing (CMP) with a polish stop at the silicon nitride layer. The metal layer forms a metal plug. The silicon nitride layer prevents erosion of the oxide layer during the polishing step to complete formation of a metal plug in the fabrication of an integrated circuit device.

21 Claims, 5 Drawing Sheets

METHOD FOR IMPROVING OXIDE EROSION OF TUNGSTEN CMP OPERATIONS

BACKGROUND OF THE INVENTION (1) Field of the Invention

The invention relates to a method of metallization in the fabrication of integrated circuits, and more particularly, to a method of preventing oxide erosion in a tungsten plug process in the manufacture of integrated circuits.

(2) Description of the Prior Art

In a typical tungsten plug process, openings are etched in a dielectric layer to contact underlying semiconductor device regions. A metal layer, such as tungsten or aluminum, is deposited over the dielectric layer and within the openings. The excess metal over the dielectric layer may be polished away using chemical mechanical polishing (CMP). Usually, the dielectric layer is an oxide layer. FIG. 1A illustrates tungsten filled openings through an oxide layer 18 overlying a semiconductor substrate 10. In section A, an isolated tungsten plug is shown. Section B shows a dense plug area. Tungsten 30 and barrier metal layer 28 are to be polished away over the oxide layer to leave tungsten plugs only within the openings. FIG. 1B illustrates the device after chemical mechanical polishing (CMP). Plug dishing C occurs in the isolated plug area A. Both plug dishing and oxide erosion D occur in the dense plug area B. Oxide erosion control is a challenge unique to the tungsten chemical mechanical polishing planarization process because 1) high oxide erosion brings about difficulties in subsequent lithography and etch steps and 2) high oxide erosion is a major cause of contact/via seam exposure as device sizes shrink to sub-quarter-micron technology. This exposure degrades electrical performance. Currently, major efforts on oxide erosion have focused on slurry composition, pad hardness, and process parameter optimization (e.g. platen speed and carrier down-force, etc.). Only limited improvement is gained from these methods.

U.S. Pat. No. 6,001,730 to Farkas et al teaches a two-step CMP of copper where a tantalum nitride barrier layer also acts as a polish stop. This barrier layer must be removed to avoid short circuiting. Removal of the barrier layer will cause oxide erosion. U.S. Pat. No. 6,057,602 to Hudson et al uses a low friction material such as graphitic carbon in polishing tungsten to reduce oxide loss at the field oxide area. There is no evidence that this graphitic carbon can help to reduce oxide erosion in the dense metal plug area. U.S. Pat. No. 6,071,809 to Zhao shows a double polish stop of silicon dioxide over silicon nitride in polishing metal including tungsten and copper. U.S. Pat. No. 6,048,796 to Wang et al teaches a silicon nitride protective layer over oxide. After CMP of a copper and barrier metal layer, the protective layer prevents penetration of the oxide layer by conductive particles left after CMP. U.S. Pat. No. 5,385,867 to Ueda et al discloses the use of a barrier layer as polish stop in the CMP of Al—Cu—Si. Removal of the conductive barrier layer causes oxide erosion. Co-pending U.S. patent application Ser. No. 09/442,493 to S. Gupta et al filed on Nov. 19, 1999 teaches using a silicon nitride diffusion step layer in a copper plug process. In the case of direct copper etch, the silicon nitride is an etch stop layer. In the case of dual damascene, silicon nitride is deposited on the oxide surface with the copper trench exposed after copper CMP. The silicon nitride layer is used to prevent copper from diffusing into the oxide. Allowed U.S. patent application Ser. No. 09/110,419 to R. Sudipto filed on Jul. 6, 1998 teaches the use of a titanium nitride polish stop layer in a tungsten plug process. Again, when the titanium nitride layer is removed, oxide erosion will occur.

SUMMARY OF THE INVENTION

A principal object of the present invention is to provide an effective and very manufacturable method of metal plug formation in the fabrication of integrated circuit devices.

Another object of the invention is to provide a method of reducing oxide erosion in the metal plug process.

Yet another object of the invention is to reduce oxide erosion in the metal plug process by employing a silicon nitride polish stop layer over the oxide.

A further object of the invention is to reduce oxide erosion in the tungsten or aluminum plug process by employing a silicon nitride polish stop layer over the oxide.

In accordance with the objects of this invention a new method to prevent oxide erosion in a metal plug process by employing a silicon nitride layer over the oxide is achieved. An oxide layer is deposited overlying a semiconductor substrate. A silicon nitride layer is deposited overlying the oxide layer. Openings are etched through the silicon nitride layer and into the oxide layer. A barrier metal layer is deposited overlying the silicon nitride layer and into the openings. A metal layer is deposited overlying the barrier metal layer. The metal layer and barrier metal layer are polished away using chemical mechanical polishing (CMP) with a polish stop at the silicon nitride layer. The metal layer forms metal contacts and via plugs. The silicon nitride layer prevents erosion of the oxide layer during the polishing step to complete formation of metal contacts and via plugs in the fabrication of an integrated circuit device.

BRIEF DESCRIPTION OF THE DRAWINGS in the accompanying drawings forming a material part of this description, there is shown:

FIGS. 3 through 7 schematically illustrate in cross-sectional representation a preferred embodiment of the present invention.

Figure 8:
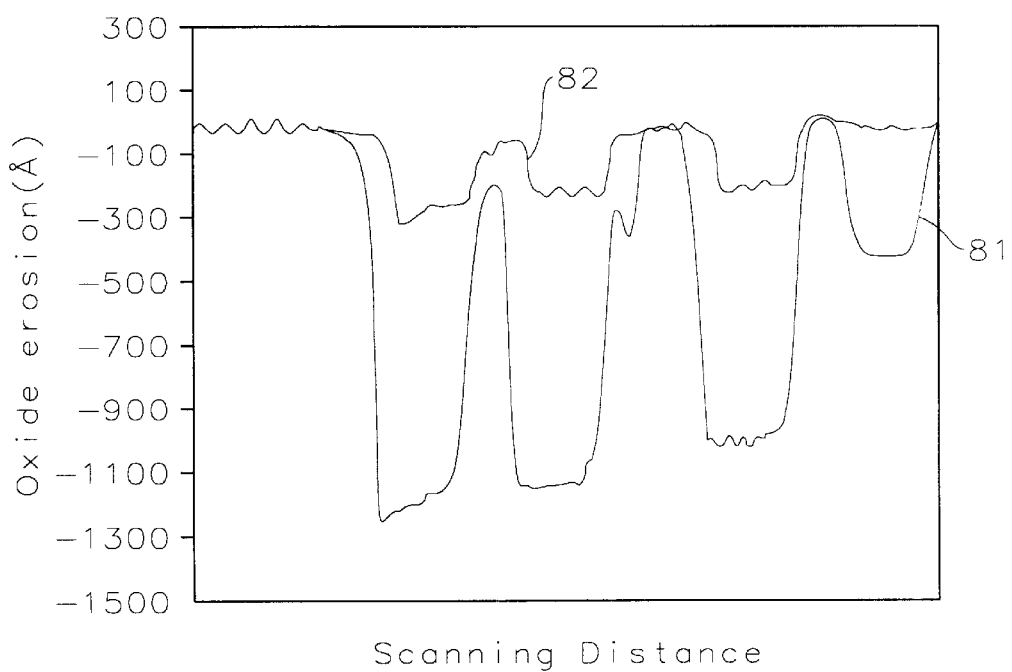

FIG. 8 graphically illustrates a comparison of the oxide erosion effects observed in a prior art process and in the process of the present invention.

DESCRIPTION OF THE PREFERRED EMBODIMENTS

Figure 1A:
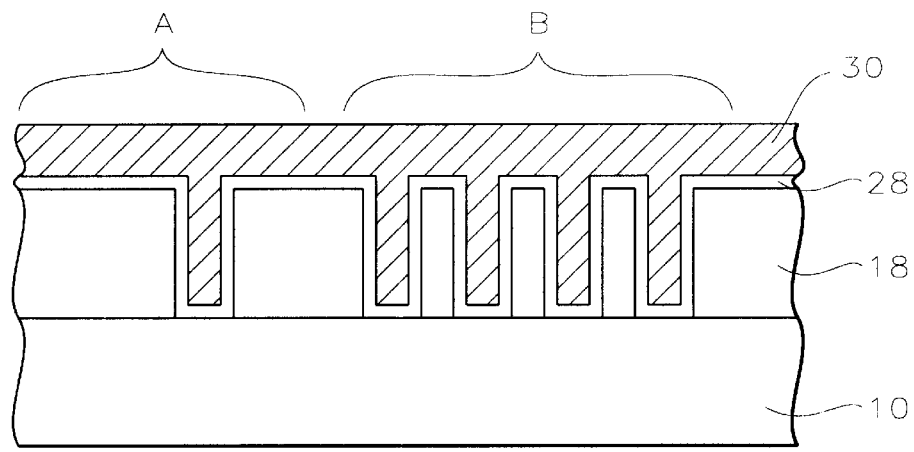
FIGS. 1A and 1B are cross-sectional representations of plug dishing and oxide erosion of the prior art.
Figure 1B:
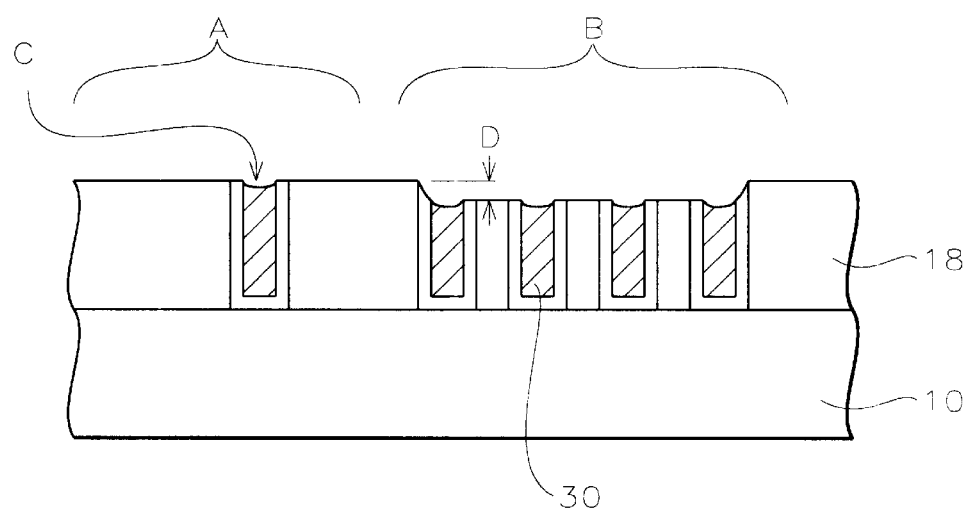
Figure 2:
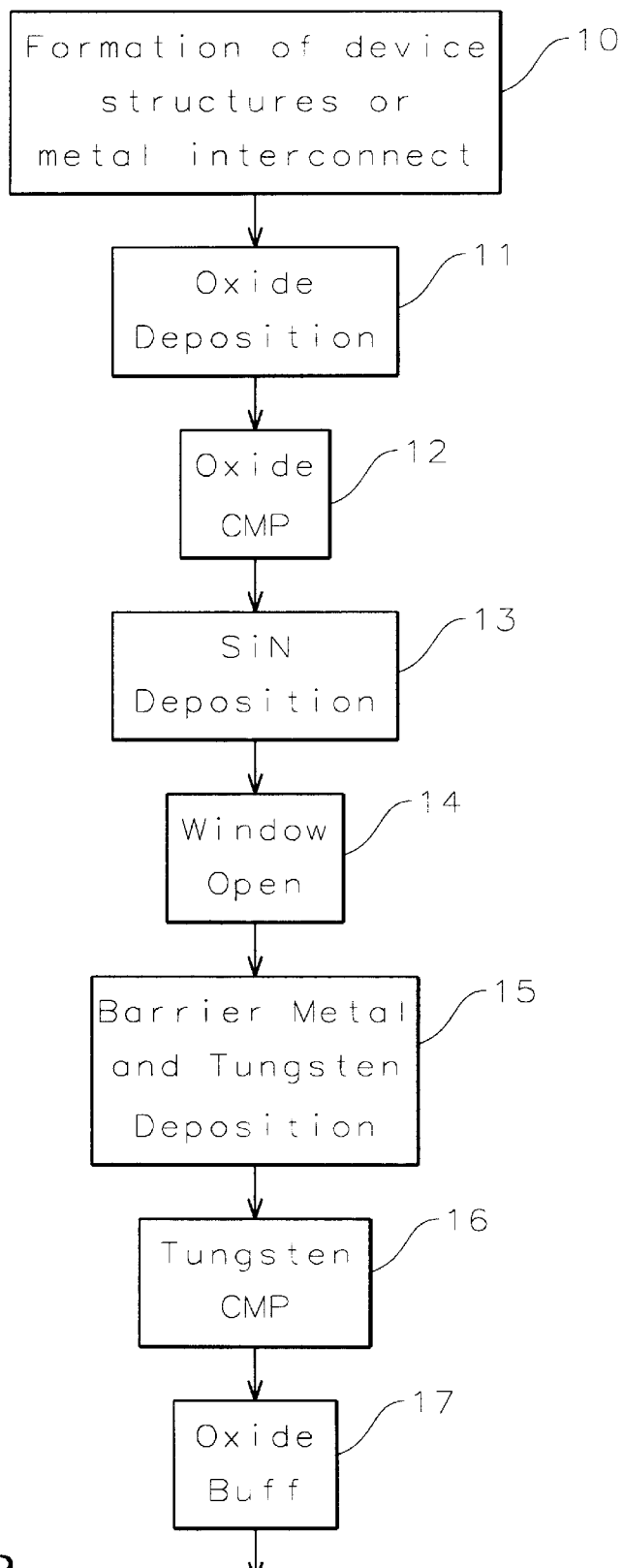
FIG. 2 is a flowchart showing the process steps of the present invention.
Figure 3:
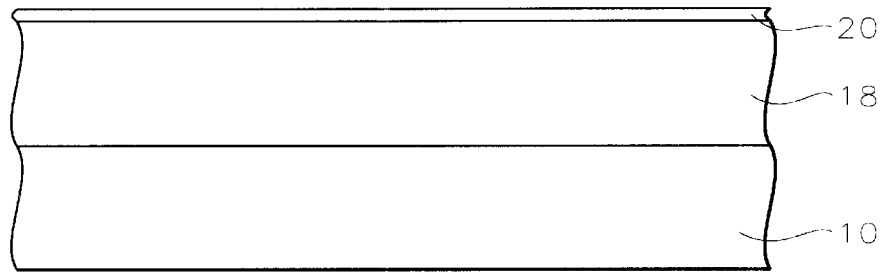

Referring now more particularly to FIG. 3, there is illustrated a portion of a partially completed integrated circuit device. There is shown a semiconductor substrate 10, preferably composed of monocrystalline silicon. A pre-metal dielectric (PMD) or intermetal dielectric (IMD) layer 18 is deposited on the substrate wafer. Semiconductor devices structures, such as gate electrodes, source and drain regions, or metal interconnects, not shown, may be formed in and on the semiconductor substrate and covered by the PMD or IMD layer 18. Refer also to FIG. 2, a flowchart of the steps of the inventive process. Step 10 is the formation of device structures or metal interconnects within layer 10. The PMD or IMD layer 18 typically comprises oxide, such as sub-atmospheric borophosphosilicate glass (SABPSG), phosphosilicate glass (PSG), plasma-enhanced tetraethoxysilane (PE-TEOS) oxide, silicon rich oxide (SRO), or their combinations. This deposition is the oxide deposition of step 11. The PMD or IMD layer 18 is planarized, such as by chemical mechanical polishing (CMP), step 12.

Now, in a key process step of the present invention, a silicon nitride layer 20 is deposited over the planarized oxide layer 18, as shown in FIG. 3 and as step 13 in FIG. 2. The silicon nitride layer 20 is deposited to a thickness of between about 200 and 1500 Angstroms. The silicon nitride layer 20 will act as a polish stop in a subsequent step to prevent oxide erosion. Alternatively, silicon oxynitride or a combination of silicon nitride and silicon oxynitride can be used as the polish stop layer. It is important that the polish stop layer 20 be non-conductive.

Figure 4:
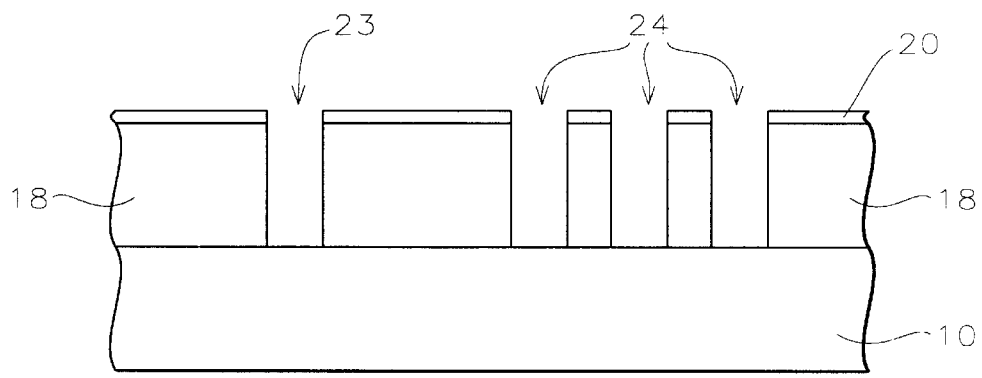

Referring now to FIG. 4, and step 14 of FIG. 2, openings 23 and 24 are etched through the polish stop layer 20 into the PMD or IMD layer 18. The opening may be made to an underlying semiconductor device structure, such as a gate electrode, source or drain region, or metal line, not shown.

Figure 5:
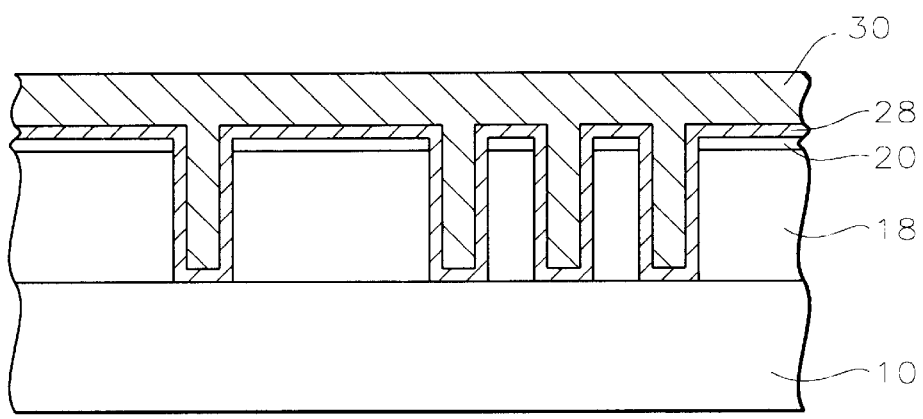

Referring now to FIG. 5 and step 15, a barrier metal layer 28 is deposited over the polish stop layer 20 and within the openings 23 and 24. The barrier metal layer may comprise, for example, titanium and titanium nitride, and may have a thickness of between about 100 and 1000 Angstroms.

Figure 6:
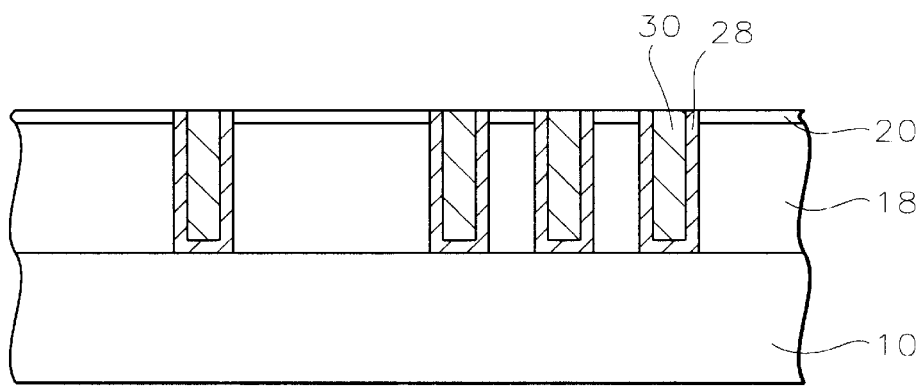

A metal layer 30 is formed over the barrier metal layer 28, as shown in FIG. 5. The metal layer may be tungsten or aluminum which will form the metal via plugs. The metal layer 30 may be deposited by any of the conventional means, including physical or chemical vapor deposition. The excess metal layer over the PMD or IMD layer is polished off by chemical mechanical polishing (CMP), as shown in FIG. 6 and step 16. The barrier metal layer 28 is also removed by the CMP step. The silicon nitride polish stop layer 20 acts as a stop layer for the polishing process to prevent erosion of the underlying oxide 18.

This completes formation of metal plug 30, as shown in FIG. 6. The silicon nitride layer 20 may be removed by the oxide buffing step 17. The oxide buffing step will not cause oxide erosion. Alternatively, the silicon nitride layer 20 may be retained. If retained, the silicon nitride layer 20 can act as an etch stop layer for subsequent metal etching.

Figure 7:
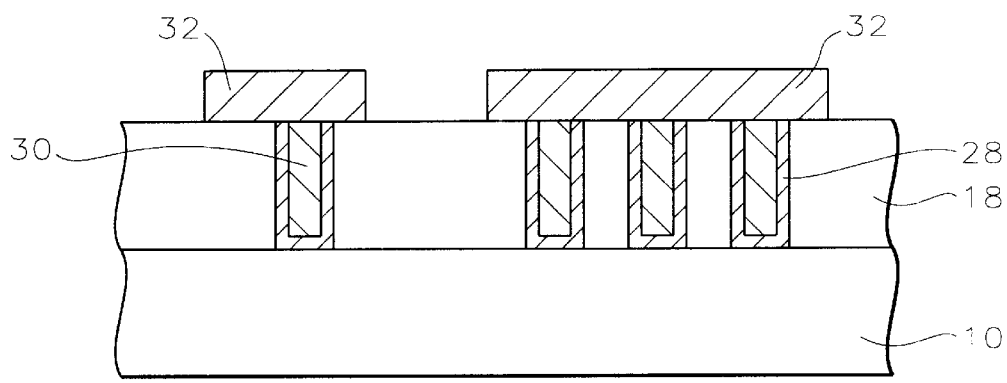

For example, as shown in FIG. 7, a second metal layer, such as titanium/titanium nitride and aluminum, may be sputter deposited over the surface of the substrate. The second metal layer is patterned to form metal lines 32. The silicon nitride layer 20 acts as an etch stop layer during this patterning.

EXAMPLE

The following example is given to show the important features of the invention and to aid in the understanding thereof. Variations may be made by those skilled in the art without departing from the spirit and scope of the invention.

Experiments were performed to determine oxide erosion after tungsten CMP in areas of high plug density, such as that illustrated on the righthand side of the FIGS. 3–7. The process of the present invention using a silicon nitride capping layer was compared to a process wherein no silicon nitride capping layer was used.

FIG. 8 illustrates the oxide erosion in a device having a tungsten plug density of 0.36 μm between plugs and a plug diameter of 0.36 μm. Line 81 illustrates the oxide erosion of about 1250 Angstroms for the case where no silicon nitride cap was used. Line 82 illustrates the oxide erosion of about 300 Angstroms in the process of the present invention using the silicon nitride cap. This graph shows that the silicon nitride capping layer of the present invention significantly reduces oxide erosion in areas with high plug density.

The process of the present invention provides a method for preventing oxide erosion and thinning, consequently achieving better planarity and improving plug seam exposure issues. The silicon nitride polish stop layer of the invention provides a simple and effective solution to the oxide erosion problem in the metal plug process.

While the invention has been particularly shown and described with reference to the preferred embodiments thereof, it will be understood by those skilled in the art that various changes in form and details may be made without departing from the spirit and scope of the invention.

What is claimed is:

1. A method of forming a metal plug in the fabrication of an integrated circuit device comprising:

depositing an oxide layer overlying a semiconductor substrate and planarizing said oxide layer;

depositing a silicon nitride layer overlying said oxide layer;

etching a plug opening through said silicon nitride layer and said oxide layer;

depositing a barrier metal layer overlying said silicon nitride layer and within said plug opening;

depositing a metal layer overlying said barrier metal layer wherein said metal layer is tungsten or aluminum; and polishing away said metal layer and said barrier metal layer with a polish stop at said silicon nitride layer whereby said metal layer forms said metal plug within said plug opening and wherein said silicon nitride layer prevents erosion of said oxide layer during said polishing step to complete said formation of said metal plug in the fabrication of said integrated circuit device.

2. The method according to claim 1 further comprising forming semiconductor device structures including gate electrodes and source and drain regions in and on said semiconductor substrate wherein said semiconductor device structures are covered by said oxide layer and wherein said metal plug contacts one of said semiconductor device structures.

3. The method according to claim 1 wherein said silicon nitride layer has a thickness of between about 200 and 1500 Angstroms.

4. The method according to claim 1 wherein said silicon nitride layer comprises one of more of silicon nitride and silicon oxynitride.

5. The method according to claim 1 wherein said barrier metal layer comprises one or more of the group containing titanium and titanium nitride.

6. The method according to claim 1 wherein said step of polishing away said metal layer and said barrier metal layer comprises chemical mechanical polishing (CMP).

7. The method according to claim 1 further comprising removing said silicon nitride layer after said step of polishing said metal layer and said barrier metal layer.

8. The method according to claim 1 further comprising:

depositing a second metal layer overlying said silicon nitride layer and said metal plug wherein said second metal layer is tungsten or aluminum; and patterning said second metal layer to form a metal line overlying said metal plug wherein said silicon nitride layer acts as an etch stop during said patterning.

9. A method of forming metal plugs in the fabrication of an integrated circuit device comprising:

depositing an oxide layer overlying a semiconductor substrate and planarizing said oxide layer;

depositing a silicon nitride layer overlying said oxide layer;

etching a plurality of plug openings through said silicon nitride layer and said oxide layer;

depositing a barrier metal layer overlying said silicon nitride layer and within said plug openings;

depositing a metal layer overlying said barrier metal layer wherein said metal layer is tungsten or aluminum; and polishing away said metal layer and said barrier metal layer with a polish stop at said silicon nitride layer whereby said metal layer forms said metal plugs within said plug openings and wherein said silicon nitride layer prevents erosion of said oxide layer during said polishing step to complete said formation of said metal plugs in the fabrication of said integrated circuit device.

10. The method according to claim 9 further comprising forming semiconductor device structures including gate electrodes and source and drain regions in and on said semiconductor substrate wherein said semiconductor device structures are covered by said oxide layer and wherein said metal plugs contact some of said semiconductor device structures.

11. The method according to claim 9 wherein said silicon nitride layer has a thickness of between about 200 and 1500 Angstroms.

12. The method according to claim 9 wherein said silicon nitride layer comprises one or more of silicon nitride and silicon oxynitride.

13. The method according to claim 9 wherein said barrier metal layer comprises one or more of the group containing titanium and titanium nitride.

14. The method according to claim 9 wherein said step of polishing away said metal layer and said barrier metal layer comprises chemical mechanical polishing (CMP).

15. The method according to claim 9 further comprising removing said silicon nitride layer after said step of polishing said metal layer and said barrier metal layer.

16. The method according to claim 9 further comprising:

depositing a second metal layer overlying said silicon nitride layer and said metal plug wherein said second metal layer is tungsten or aluminum; and patterning said second metal layer to form a metal line overlying said metal plug wherein said silicon nitride layer acts as an etch stop during said patterning.

17. A method of metallization in the fabrication of an integrated circuit device comprising:

depositing an oxide layer overlying a semiconductor substrate and planarizing said oxide layer;

depositing a silicon nitride layer overlying said oxide layer;

etching a plurality of plug openings through said silicon nitride layer and said oxide layer wherein said plug openings are as close as 0.36 microns together;

depositing a barrier metal layer overlying said silicon nitride layer and within said plug openings;

depositing a tungsten layer overlying said barrier metal layer;

polishing away said tungsten layer and said barrier metal layer using chemical mechanical polishing with a polish stop at said silicon nitride layer whereby said tungsten layer forms tungsten plugs within said plug openings and wherein said silicon nitride layer prevents erosion of said oxide layer during said polishing step;

depositing a second metal layer overlying said silicon nitride layer and said tungsten plugs; and patterning said second metal layer to form metal lines overlying said tungsten plugs wherein said silicon nitride layer acts as an etch stop during said patterning to complete said metallization in said fabrication of said integrated circuit device.

18. The method according to claim 17 further comprising forming semiconductor device structures including gate electrodes and source and drain regions in and on said semiconductor substrate wherein said semiconductor device structures are covered by said oxide layer and wherein said tungsten plugs contact some of said semiconductor device structures.

19. The method according to claim 17 wherein said silicon nitride layer has a thickness of between about 200 and 1500 Angstroms.

20. The method according to claim 17 wherein said silicon nitride layer comprises one or more of silicon nitride and silicon oxynitride.

21. The method according to claim 17 wherein said barrier metal layer comprises one or more of the group containing titanium and titanium nitride.

* * * * *